United States Patent [19]
Nakano

[11] Patent Number: 5,825,249
[45] Date of Patent: Oct. 20, 1998

[54] MULTISTAGE SOURCE FOLLOWER AMPLIFIER HAVING A WIDE BANDWIDTH AND LOW POWER CONSUMPTION

[75] Inventor: Takashi Nakano, Tokyo, Japan

[73] Assignee: NEC Corporation, Tokyo, Japan

[21] Appl. No.: 782,071

[22] Filed: Jan. 13, 1997

[30] Foreign Application Priority Data

Jan. 12, 1996 [JP] Japan ................................ 8-021774
Jan. 8, 1997 [JP] Japan ................................ 9-013123

[51] Int. Cl.$^6$ .............................. H03F 3/16; H03F 3/68
[52] U.S. Cl. ........................................ 330/277; 330/310
[58] Field of Search .................................. 330/277, 307, 330/308, 310, 311

[56] References Cited

U.S. PATENT DOCUMENTS 4,668,971 5/1987 Hynecek .............................. 377/60 X
5,192,920 3/1993 Nelson et al. ........................... 330/277

OTHER PUBLICATIONS

N. Mutoh et al., "New Low–Noise Output Amplifier for High–Definition CCD Image Sensor", *IEEE Transactions on Electron Devices*, vol. 38, No. 5, May 1991, pp. 1048–1051.

N. Mutoh et al., "New Low Noise Output Amplifier for High Definition CCD Image Sensor," 1989 IEEE, Mar. 1989, pp. 7.5.1 –7.5.4.

D. Sauer et al., "A CCD Comb Filter IC for TV Receivers," 1980 IEEE International Solid–State Circuits Conference, Feb. 1980, pp. 32–33 and 258.

*Primary Examiner*—Steven Mottola
*Attorney, Agent, or Firm*—Sughrue, Mion, Zinn, Macpeak & Seas, PLLC

[57] ABSTRACT

In a multistage source follower amplifier having input and output terminals, an output source follower amplifier has an output drive transistor of a surface channel type and a load which is connected to the output drive transistor. An input source follower amplifier has an input drive transistor and a load which is connected to the input drive transistor. A middle source follower amplifier unit is located between the input and the output source follower amplifiers and comprises a middle drive transistor of a buried channel type and a middle load which is connected to the middle drive transistor. The input source follower amplifier, the middle source follower amplifier unit, and the output source follower amplifier are connected in cascade to one another between the input and the output terminals.

10 Claims, 6 Drawing Sheets

MULTISTAGE SOURCE FOLLOWER AMPLIFIER HAVING A WIDE BANDWIDTH AND LOW POWER CONSUMPTION

BACKGROUND OF THE INVENTION

This invention relates to a multistage source follower amplifier which is used in a solid-state image pickup device, such as a CCD image pickup device, and in particular to the multistage source follower amplifier suitable for high-definition television (HDTV) systems.

Heretofore, it is a recent trend that a solid-state image pickup device for high-definition television (HDTV) is driven by a high drive frequency because of an increase of picture cells (pixels), for example, 2 million pixels or so. Such a solid-state image pickup device is formed on a semiconductor chip or substrate and has a plurality of photodiodes, a plurality of vertical CCDs, and a pair of horizontal CCDs all of which are arranged on the semiconductor chip. With this structure, each photodiode carries out optic-electric conversion to produce an electric signal which is vertically and horizontally transferred through the vertical CCDs and the horizontal CCDs to be sent to an output amplifier through a buffer amplifier which is composed of a source follower amplifier, as mentioned above, and which serves to match impedances between the solid-state image pickup device and the output amplifier.

Herein, recent requirements to a buffer amplifier are to widen a bandwidth, to reduce a noise and power consumption, and to have a linear input-output characteristic, as the drive frequency becomes high in the solid-state image pickup device.

To this end, a multistage source follower amplifier has been disclosed by N. Mutoh et al in the article titled in "New Low-Noise Output Amplifier for High-Definition CCD Image Sensor" on TEEE TRANSACTIONS ON ELECTRON DEVICES, VOL. 38, No.5, May 1991. The multistage source follower amplifier disclosed in the article has three stages which are formed by source follower connected in cascade to one another and which are composed of an input or first stage, a middle or second stage, and an output or third stage of the source followers. In this event, each stage of the source followers is structured by a drive transistor and a load transistor both of which are connected in series to each other and which are formed by metal oxide semiconductor field effect transistors (MOSFETs), respectively.

It is to be noted that the MOSFETs which are used in the solid-state image pickup device of this kind are classified into a surface channel type and a buried channel type which have a channel adjacent to a substrate surface and a channel mainly formed within the substrate, respectively.

In the multistage source follower disclosed in the above-mentioned article, only the drive transistor of the first or the input stage is formed by the surface channel type MOSFET while the remaining drive and load transistors are formed by the buried channel type MOSFETs in consideration of a gain and the noise.

However, it has been found out that this structure brings about an increase of power consumption and deteriorates the linearity of the input-output characteristic.

SUMMARY OF THE INVENTION

It is an object of this invention to provide a multistage source follower amplifier which has a linear input-output characteristic over a wide bandwidth.

It is another object of this invention to provide a multistage source follower which is capable of reducing power consumption.

Other objects of this invention will become clear as the description proceeds.

According to an aspect of this invention, a multistage source follower amplifier comprises a first source follower amplifier which has a first drive transistor and a first load. The first drive transistor and the first load are connected to the first drive transistor. A middle source follower amplifier unit comprises a middle drive transistor of a buried channel type which is connected to the first drive transistor and a middle load which is connected to the middle drive transistor. An output source follower amplifier is electrically coupled to the middle source follower amplifier unit and has a third drive transistor of a surface channel type and a third load which is connected to the third drive transistor.

DESCRIPTION OF THE PREFERRED EMBODIMENT

Referring to FIGS. 1 through 5, description will be at first directed to a conventional multistage source follower amplifier for a better understanding of this invention.

Figure 1:
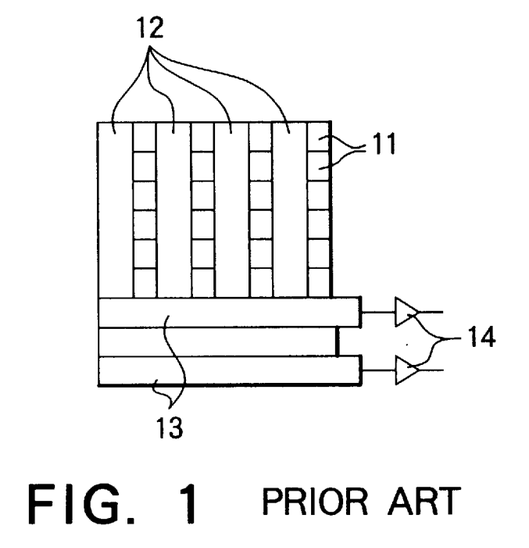
FIG. 1 shows a charge-coupled image sensor.

In FIG. 1, a charge-coupled image sensor is used for a high definition television camera and may be a solid-state image sensor formed by a semiconductor integrated circuit. The charge-coupled image sensor comprises photodiodes 11 (shown by small square) which are arranged in a plurality of columns. A plurality of vertical charge-coupled devices (CCDs) 12 are arranged in parallel to each other and are electrically coupled with the photodiodes 11 of each corresponding column. Two horizontal CCDs 13 are electrically coupled with the plurality of vertical CCDs 12 at the ends thereof. Two preamplifiers 14 are connected to the horizontal CCDs 13, respectively.

The conventional multistage source follower amplifier is included in each of the preamplifiers 14.

Each of the photodiodes 11 carries out optic to electric convertion to supply an electric signal to one of the vertical CCDs 12. Each of the vertical CCDs 12 transfers the electric signal to the horizontal CCDs 13. Each of the horizontal CCDs 13 is alternately operated at a half of a desirable drive frequency and transmits the electric signal to the one of the preamplifiers 14 at the half of the desirable drive frequency. As a result, both of the horizontal CCDs 13 are operated at the desirable operating frequency as a result of the alternate operation. Each of the preamplifiers 14 amplifies the electric signal into an amplified signal which is to an external circuit, such as an output amplifier (not shown).

Figure 2:
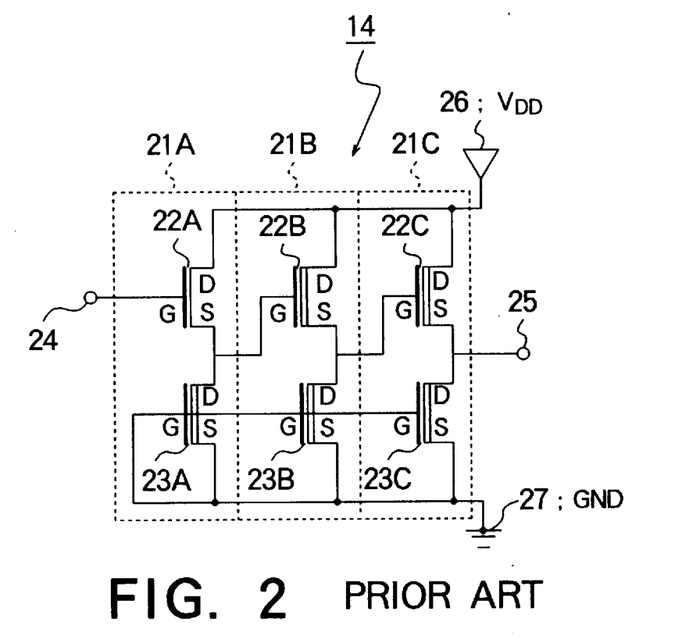
FIG. 2 is a circuit diagram of a conventional multistage source follower amplifier.

In FIG. 2, the multistage source follower amplifier (which may be equivalent to the preamplifier and which is therefore depicted by 14) has first, second, third stages of source followers 21a, 21b, and 21c. The source followers 21a to 21c comprise a drive transistor 22a, 22b, and 22c and a load transistor 23a, 23b, and 23c, respectively. The source followers 21a, 21b, and 21c are connected i cascade to one another between an input terminal 24 and an output terminal 25. In addition, each source follower 21a to 21c is connected in parallel to one another between a power source 26 ($V_{DD}$) and the ground 27 (GND). In this connection, the drive transistors 22a, 22b, and 22c have drains connected to the power source 26 in common and sources connected to drains of the load transistors 23a, 23b, and 23c, respectively. The source of the drive transistor 22c and the drain of the load transistor 23c are connected in common to the output terminal 25. The drive transistor 22a of the first stage has a gate which is connected to the input terminal 24. While the drive transistor 22b of the second stage has a gate which is connected to a connection point between the source of the drive transistor 22a and the drain of the load transistor 23a. The drive transistor 22c of the third stage has a gate which is connected to a connection point between the source of the drive transistor 22b and the drain of the load transistor 23b. The load transistors 23a, 23b, and 23c have gates and sources both of which are connected in common to the ground.

Herein, it is to be noted that the drive transistor 22a is structured by a surface channel type metal oxide semiconductor field effect transistor (MOSFET) so as to accomplish a linear input-output characteristic of the source follower amplifier. The remaining drive transistors 22b and 22c and load transistors 23a, 23b, and 23c are formed by the buried channel type MOSFETs so as to suppress an internal noise of the multistage source follower amplifier.

Figure 3:
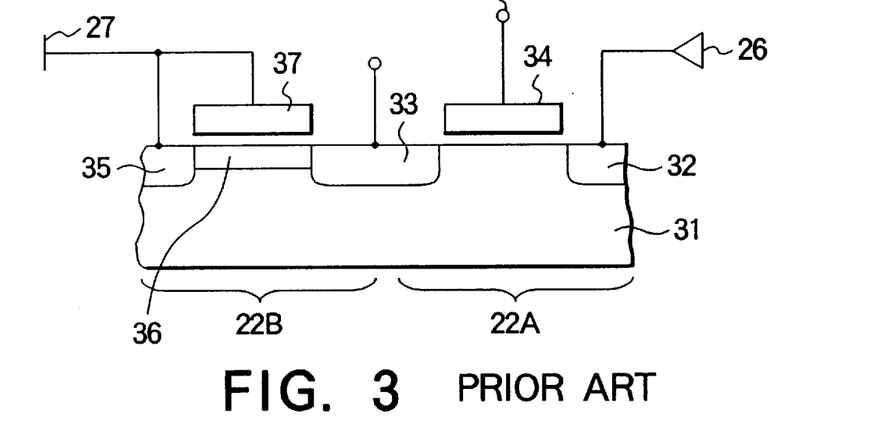
FIG. 3 shows a sectional view of an first stage of the conventional multistage source follower amplifier of FIG. 2.

In FIG. 3, the surface channel type MOSFET of an N channel type (or the drive transistor 22a) is shown at an righthand of FIG. 3 and comprises a P well 31 which is formed by implanting ions into a silicon substrate of an N type. In this event, the ion implantation is carried out at a few hundreds kev in a dose of the order of $10^{12}$ cm$^{-2}$. A drain region 32 and an output region (source region) 33 are formed by doping N type impurities of, for example phosphorus, into the P well 31. A part of the P well 31 is operable as a channel or a gate region between the drain region 32 and the output region 33. A gate electrode 34 is formed above the gate region by a polysilicon on a insulating film (not shown), such as an oxide silicon film, a silicon nitride film sandwiched between two oxide silicon films. N type impurities of, for example, phosphorus, are doped into the electrode 34 so that the electrode 34 has a low resistance like a metal. An N type channel is formed near a surface of the gate region between the drain region 32 and the output region 33 when an input voltage is supplied to the gate electrode 34 through the input terminal 24. The surface channel type MOSFET is substantially identical with an enhancement type MOSFET and has a positive threshold voltage. This means that the illustrated surface channel type MOSFET is normally put into an off state.

On the other hand, the buried channel type MOSFET specified by the load transistor 23a is shown on the lefthand of FIG. 3. The illustrated buried channel type MOSFET represents an N type channel MOSFET and comprises the P well 31 used in common to the surface channel type MOS-FET. A source region 35 is formed within the P well 31. While a drain region is used for the output region 33. An N well 36 is formed by implanting ions at a few hundreds keV in a dose of the order of $10^{12}$ cm$^{-2}$ and is located between the output region 33 and the source region 35. The N well 36 is used as a gate region. A gate electrode 37 is formed above the N well 36 like the electrode 34 on the insulating film (not shown). An N channel is mainly formed under N well 36 between the output region 33 and the source region 35 when an input voltage is supplied to the gate electrode 37. Thus, the buried channel type MOSFET has a buried channel under the N well 36. In this case, the gate electrode 37 is grounded. The buried channel type MOSFET has a negative threshold voltage and is normally put in an on state.

If a voltage is given between the output region 33 and the source region 35 in the buried type MOSFET, then a drain current is caused to flow through the buried channel between the output region 33 and the source region 35 regardless of the input voltage.

Figure 4:
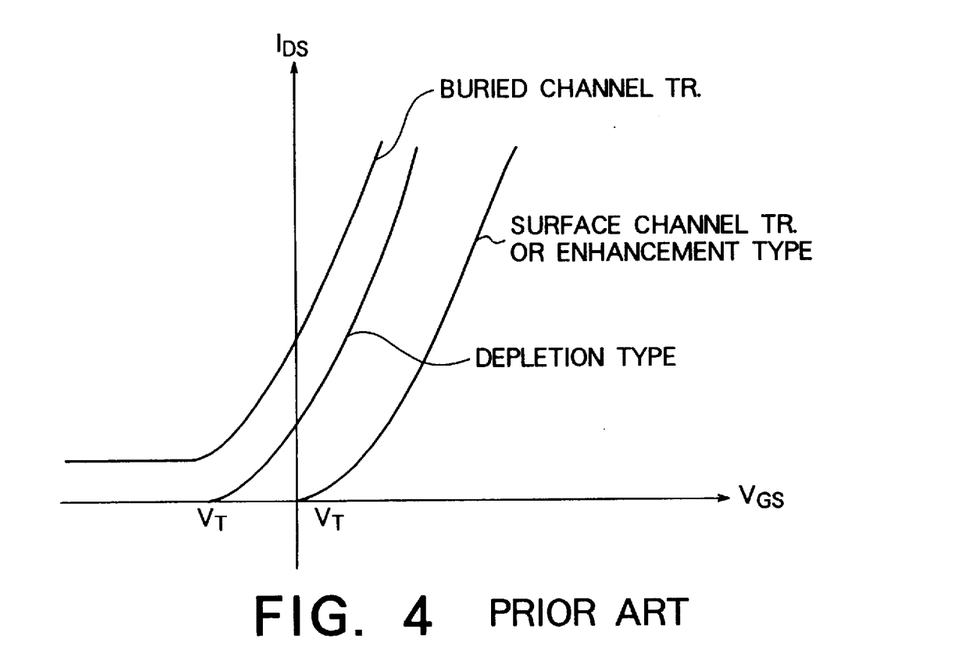
FIG. 4 is a graph of $V_{GS}$-$I_{DS}$ characteristics of MOSFETs.

In FIG. 4, $V_{GS}$-$I_{DS}$ characteristics are illustrated in connection with the surface channel type MOSFET, the buried channel type MOSFET, and a depletion type MOSFETs for comparison. As readily understood from FIG. 4, a current $I_{DS}$ always flows through the drain and the source regions in the buried channel type MOSFET.

The multistage source follower amplifier has a band width which is determined by a cut off frequency at which a gain of the conventional multistage source follower amplifier is reduced by 3 dB from a maximum gain. It is required that the band width is about three times the operating frequency (37 MHz) of the horizontal CCD 14. In the future, it will be expected that the operating frequency of the horizontal CCD 14 will become high to cope with an increase of pixels so as to satisfy requirements of a high resolution and an increase of a data processing time for multimedia. Accordingly, the source follower amplifier should have a wide bandwidth so that it is effectively operable at such a high operating frequency.

Figure 5:
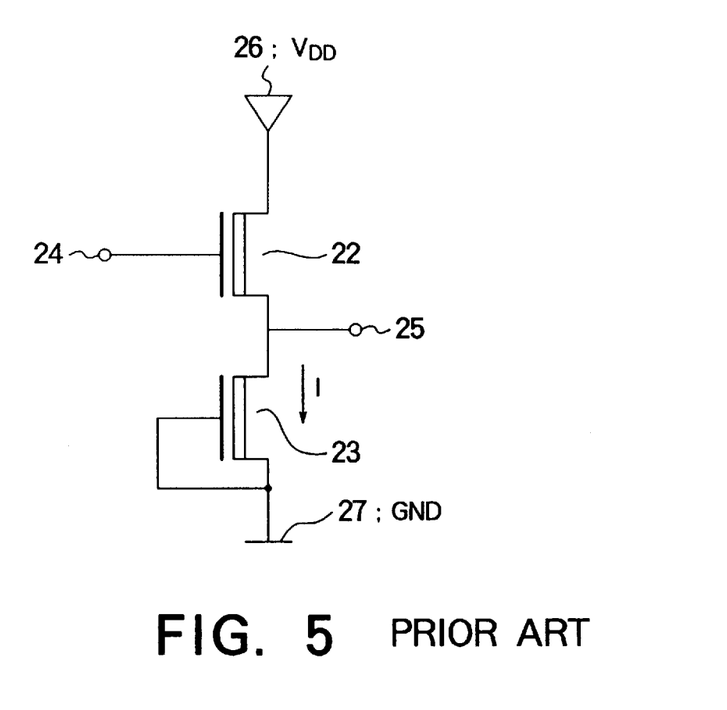
FIG. 5 is a circuit diagram of a single source follower amplifier.

Referring to FIG. 5, consideration will be made about a single source follower so as to facilitate an understanding of this invention. A cut off frequency ft of the single source follower is given by:

$$ft = 2*\pi*gm/C \qquad (1)$$

where C is representative of a load capacitance and gm, a transconductance given by:

$$gm = \mu*C_{OX}*(W/L)*(Vi-Vo-Vt) \qquad (2)$$

where in turn $\mu$ represents, a mobility of electrons in the drive transistor 22; W, a gate width of the drive transistor 22; L, a gate length of the drive transistor 23; $C_{OX}$, a gate capacitance of the drive transistor 22; Vt, a threshold voltage of the drive transistor 22; Vi, an input voltage supplied to the input terminal 24; and Vo, an output voltage supplied to the output terminal 25.

Generally, a ratio of the gate width W to the gate length L (W/L) must become large to raise the cut off frequency ft in the single source follower. In this case, enlargement of the W/L gives rise to an increase of the output voltage Vo. In the multistage source follower, the increase of the output voltage Vo at a stage results in an increase of the input voltage Vi for a later stage. In the later stage, a voltage of "Vi-Vo-Vt" (namely, a gate-source voltage $V_{GS}$-Vt) decrease to a value which is smaller than "a power source voltage $V_{DD}$-Vo" (namely, a drain-source voltage $V_{DS}$). As a result, the drive transistor 22 of the later stage operates within a linear region (or an unsaturation region).

Then, the input-output characteristic of the multistage source follower amplifier is deteriorated in linearity. Accordingly, the increase of the output voltage Vo in each stage should be suppressed.

Therefore, the ratio of the W/L should become large in the load transistor 23 also at each stage to suppress the increase of the output voltage Vo as the W/L of the drive transistor 22 becomes large. However, a current I increases which is caused to flow from the power source 26 to the ground 27 through the drive transistor 22 and the load transistor 23. This results in an increase of power consumption. In addition, an internal noise and a gain must be considered so as to widen the band width of the multistage source follower.

An input-output characteristic of the single source follower amplifier will be considered hereinafter.

In the single source follower amplifier, the current I is given by:

$$I = (½) * \mu * C_{OX} * (W/L) * (Vi-Vo-Vt)^2 \qquad (3).$$

It is assumed that the input voltage Vi, the current I, and the W/L are constant in the example for simplicity of description. Under the circumstances, when the threshold voltage Vt is low, the output voltage Vo becomes high. The voltage of "Vi-Vo-Vt" is not changed. In this case, the transconductance gm, the gain, and the band are kept unchanged while the voltage of "$V_{DD}$-Vo" is reduced. As a result, the drive transistor 22 operates within the linear region and the input-output characteristic deteriorates in linearity when the input voltage Vi satisfies the condition, ($V_{DS}<V_{GS}$-Vt), namely, ($V_{DS}$<Vi-Vo-Vt).

This means that the surface channel type transistor is preferred as the drive transistor 22 rather than the buried channel type transistor as far as the linearity of the input-output characteristic is concerned. This is because the threshold voltage of the buried channel type transistor is lower than the threshold voltage of the surface channel type transistor.

Next, the transconductance gm will be considered hereinafter. The transconductance gm influences the gain and the band width and is preferably large.

When the equation (3) is substituted into the equation (2), the transconductance gm is given by:

$$gm = 2*I/(Vi-Vo-Vt) \qquad (5).$$

The current I, the input voltage Vi, and the threshold voltage Vt are assumed to be invariable. In this situation, the output voltage Vo becomes high, the transconductance gm desirably becomes large, as readily understood from equation (5). However, as the output voltage Vo becomes large, the linearity of the input-output characteristic becomes degraded as described above. Accordingly, the surface channel type transistor is preferable as the drive transistor 22 rather than the buried channel type transistor because the surface channel type transistor has the threshold voltage which is higher than the threshold voltage of the buried channel type transistor and achieves a low output voltage Vo and a high transconductance gm.

In an output stage of the multistage source follower amplifier, the surface channel type transistor is similarly preferred as the drive transistor 22 rather than the buried channel type transistor. This is because the output voltage is limited to a value which is lower than the source voltage $V_{DD}$.

As mentioned above, the surface channel type transistor is preferred as the drive transistor 22 rather than the buried channel type transistor to widen the band width without a deterioration of the linearity of the input-output characteristics and without an increment of the current consumption.

On the other hand, the single source follower amplifier, which has the surface channel type transistor for the drive transistor 22, has the output voltage Vo which is lower than the input voltage Vi. The single source follower amplifier, which has the buried channel type transistor for the drive transistor 22, has the output voltage Vo which is nearly equal to the input voltage Vi. Namely, the use of the surface channel type transistor for the driver transistor 22 results in a reduction of the gain in the single source follower amplifier. In the multistage source follower amplifier, a decrease of the output voltage of each stage raises the drain-source voltage $V_{DS}$ of the drive transistor in the later stage. This brings about radiation which is caused by hot electrons. Accordingly, the surface channel type transistors are limited in number in the multistage source follower amplifier. According to the inventor's experimental studies, it has been found out that the number is preferably equal to two.

If the buried channel transistor is used as the drive transistor 22 in first stage of the multistage source follower amplifier and the input voltage Vi is higher than a voltage which is slightly lower (about 95% of $V_{DD}$) than the power source voltage $V_{DD}$, the input voltage of the later stage is raised and the linearity of the input-output characteristic is deteriorated. Therefore, the surface channel type transistor is desirably used as the drive transistor 22 of the first stage of the multistage source follower amplifier.

In addition, it is preferable that the surface channel type transistor is used as the drive transistor 22 of the output stage of the multistage source follower amplifier. This is because the output stage is coupled to the external circuit and the load capacitance is large and, as a result, the output stage needs a high transconductance gm.

If the input voltage Vi is lower than the power source voltage $V_{DD}$, the buried channel type transistor may be used as the drive transistor of the first stage. In this case, the surface channel type transistor is used only as only the drive transistor of the output stage because an operating point of the first stage is low.

By the way, the single source follower amplifier produces an amplifier noise which includes a thermal noise and a 1/f noise. When the thermal noise is expressed in term of equivalent input noise power, the equivalent input noise power is proportional to a ratio of L/W of the drive transistor. Likewise, equivalent input noise power corresponding to the 1/f noise is proportional to the 1/(L*W) of the drive transistor. The amplifier noise of the source follower which uses the buried channel type transistor is about 60% of the amplifier noise of the source follower which uses the surface channel type transistor. However, either the surface channel type transistor or the buried channel type transistor can be used as the drive transistor of the last stage because the drive transistor of the output stage is very large in the W/L and L*W. Therefore, even though the surface channel type transistor is used as the drive transistor of the output stage, no problem takes place about the amplifier noise.

Figure 6:
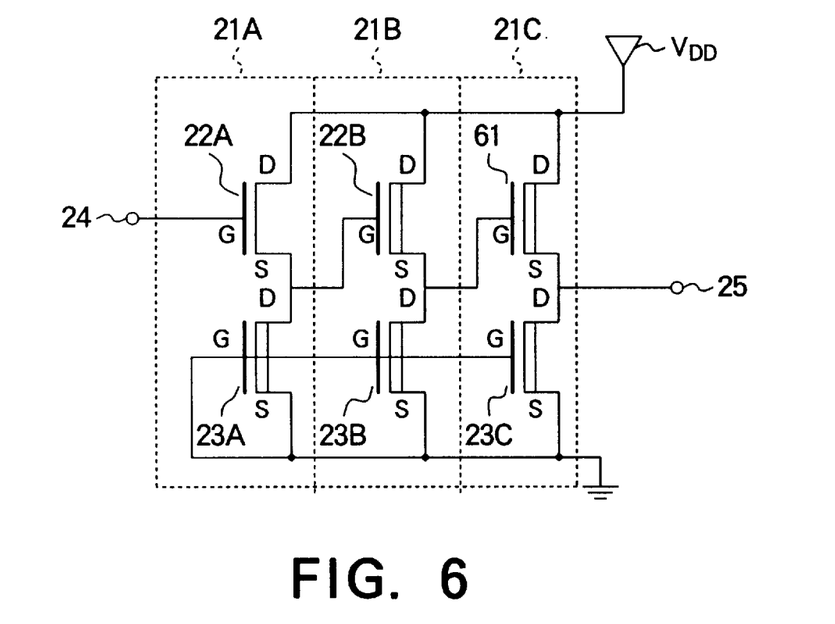
FIG. 6 is a circuit diagram of a multistage source follower amplifier according to a preferable embodiment of this invention.
Figure 7:
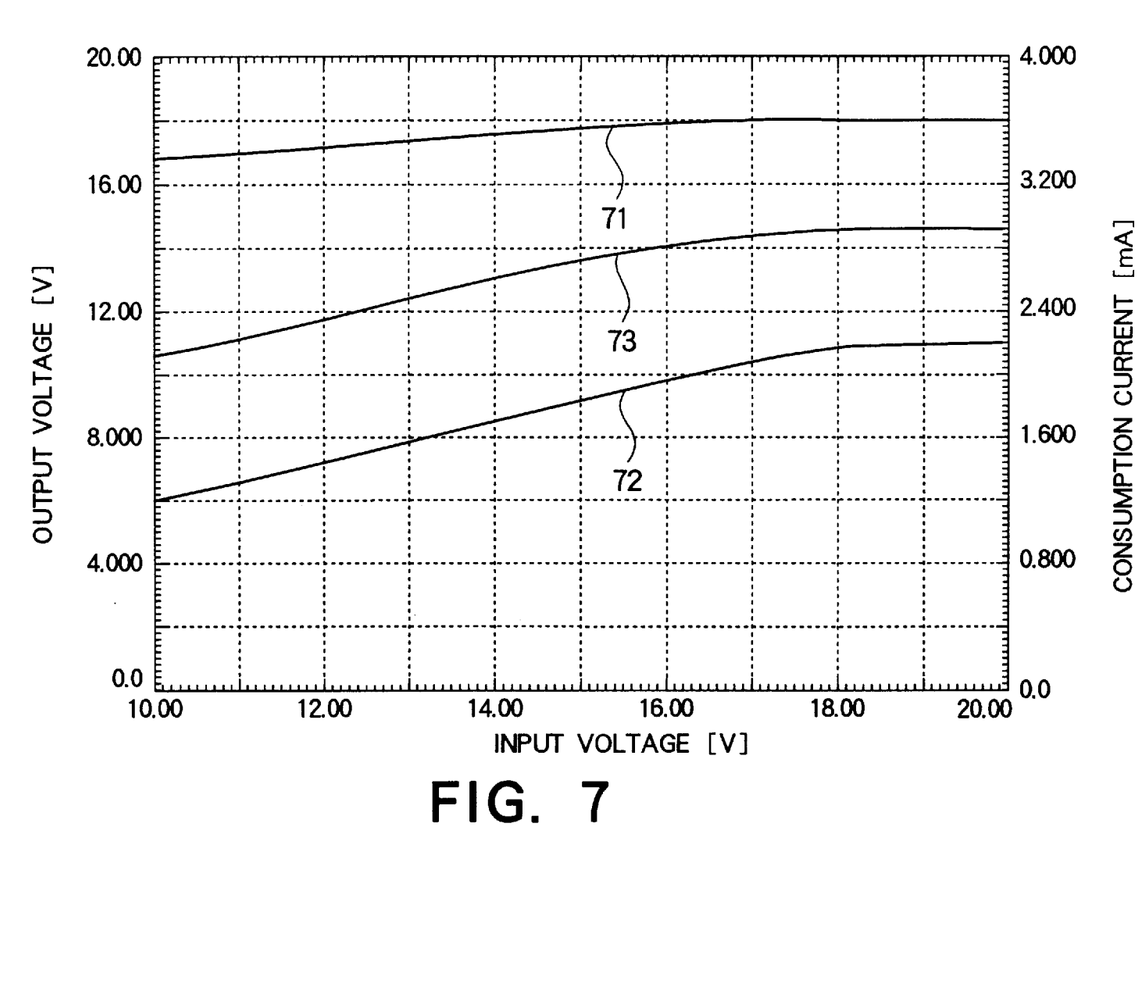
FIG. 7 is a graph of input-output characteristics of the multistage source follower amplifier of FIG. 6

Referring to FIGS. 6 and 7, description will be made about a multistage source follower amplifier according to a preferred embodiment of this invention. Similar parts are designated by like reference numerals.

In FIG. 6, a surface channel type transistor is used for a drive transistor 61 of the output source follower amplifier 21c. Each of the first and the output source follower amplifiers 21a and 21c has a structure which is illustrated in FIG. 3. Moreover, the drive and the load transistors 22b and 23b have a structure like the load transistors 23a and 23c. However, these transistors have different gate lengths and different gate widths from one another so that the multistage source follower amplifier provides a predetermined gain and a predetermined band.

The multistage source follower amplifier illustrated in FIG. 6 will be compared with the conventional multistage source follower amplifier shown in FIG. 2.

In the multistage source follower amplifier of FIG. 6, the drive transistors 22a, 22b, and 61 have the gate widths of 8 μm, 32 μm, and 600 μm, respectively, and the gate lengths of 4 μm, 5 μm, and 5 μm, respectively. The load transistors 23a, 23b, and 23c have the gate widths of 10 μm, 43 μm, and 130 μm, respectively, and the gate lengths of 26 μm, 13 μm, and 13 μm, respectively.

In the conventional multistage source follower amplifier of FIG. 2, the drive transistors 22a, 22b, and 22c have the gate widths of 8 μm, 32 μm, and 600 μm, respectively, and the gate lengths of 4 μm, 5 μm, and 5 μm, respectively. The load transistors 23a, 23b, and 23c have the gate widths of 10 μm, 43 μm, and 130 μm, respectively, and the gate lengths of 26 μm, 13 μm, and 13 μm, respectively.

The output stage of the multistage source follower amplifier of FIG. 6 has a current consumption characteristic which is shown by a solid line 71 in FIG. 7 and which is equal to a current consumption characteristic of the output stage in the conventional multistage source follower amplifier. Moreover, the multistage source follower amplifier of FIG. 6 and the conventional multistage source follower amplifier have a common transconductance gm, a common band width of 100 MHz, and a common gain of 0.62.

The multistage source follower amplifier of FIG. 6 has first input-output characteristic, as shown by a curve 72 in FIG. 7. The conventional multistage source follower amplifier has second input-output characteristic, as shown by a curve 73 in FIG. 7. While the first input-output characteristic has a first linear region where the input voltage is smaller than 17 volts, the second input-output characteristics has a second linear region where the input voltage is smaller than 16 volts. Namely, the first linear region is wider than the second linear region.

When the input voltage is 14 volts, a first operating point of the multistage source follower amplifier of FIG. 6 is 8.5 volts and a second operating point of the conventional multistage source follower amplifier is 13 volts. This means that a band of a second stage can be widened and the band of the multistage source follower amplifier of FIG. 6 can be widened as it turns out.

It is considered that the gate width of the drive transistor 61 is widened to 900 μm by 100 μm. When the gate width is equal to 600 μm, 700 μm, 800 μm, and 900 μm, the band is equal to 100 MHz, 105 MHz, 110 MHz, and 108 MHz, respectively. The band increases with the increase of the gate width to 800 μm. When the gate width is equal to 900 μm, the band is limited by a load capacitance at the second stage. However, the band can be further widened as described above.

On the other hand, the operating point at the input voltage of 14 volts about linearly increases from 8.5 volts to 9 volts and the gain increases from 0.66 to 0.67 when the gate width increases from 600 μm to 900 μm. The consumption current is fixed regardless of the gate width of the drive transistor 61.

Therefore, the multistage source follower amplifier of FIG. 6 achieves wide band width without an increase of the current consumption and deterioration of the noise and input-output characteristic.

Figure 8:
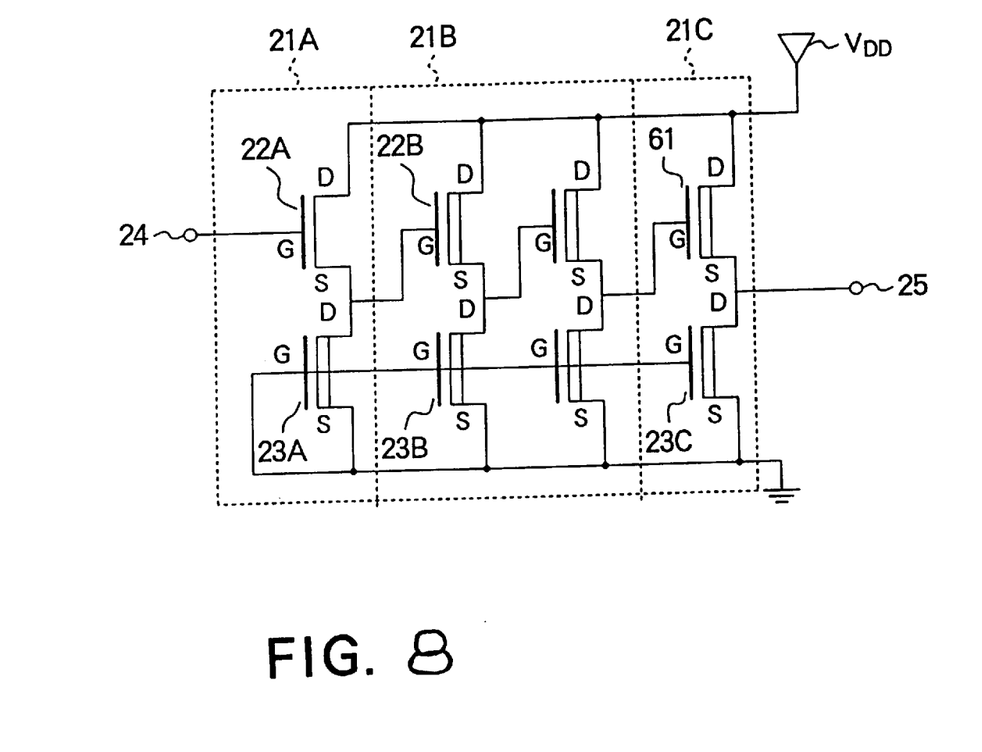
FIG. 8 is a circuit diagram of a multistage source follower amplifier according to an alternative embodiment of this invention.

As described above, the surface channel type transistors are used for the drive transistors of the first and the output stages when a maximum voltage of the input voltage Vi is higher than a voltage which is slightly lower than the power source voltage $V_{DD}$. For example, the voltage is equal to 95% of the source voltage $V_{DD}$. When the maximum voltage of the input voltage Vi is lower than the power source voltage $V_{DD}$, the surface channel type transistor is used for the drive transistor of the output stage. Similarly, the surface channel type transistors are used for the drive transistors of the first and the output stages of a multistage source follower amplifier which has four or more stages, when a maximum voltage of the input voltage Vi is higher than a voltage which is slightly lower than the power source voltage $V_{DD}$. A four stage embodiment of the multistage source follower amplifier according to the present invention is shown in FIG. 8. Moreover, the surface channel type transistor is used for the drive transistor of the output stage of the multistage source follower amplifier which has four or more stages, when the maximum voltage of the input voltage Vi is lower than the power source voltage $V_{DD}$.

This invention is very effective when the multistage source follower amplifier is coupled with the charge coupled device which has a floating diffusion type detector. This is because the maximum voltage of the input voltage is nearly equal to the power source voltage $V_{DD}$ and the linearity of the input-output characteristic is closely required in this case.

While this invention has thus far been described in conjunction with an embodiment thereof, it will be readily possible for those skilled in the art to put this invention into practice in various other manners. For example, P channel type MOS transistors may be used for the drive transistors and the load transistors. Moreover, other circuits may be coupled to the input terminal of the multistage source follower amplifier.

What is claimed is:

1. A multistage source follower amplifier comprising:

a first source follower amplifier having a first drive transistor and a first load connected to said first drive transistor;

a middle source follower amplifier unit which comprises a middle drive transistor of a buried channel type which is connected to said first drive transistor and a middle load which is connected to said middle drive transistor; and an output source follower amplifier electrically coupled to said middle source follower amplifier unit and having a third drive transistor of a surface channel type and a third load connected to said third drive transistor;

wherein said multistage source follower amplifier is supplied with a predetermined power voltage and an input signal, and wherein said first drive transistor is a surface channel type transistor when a maximum voltage of said input signal is not less than said predetermined power voltage.

2. A multistage source follower amplifier comprising:

a first source follower amplifier having a first drive transistor and a first load connected to said first drive transistor;

a middle source follower amplifier unit which comprises a middle drive transistor of a buried channel type which is connected to said first drive transistor and a middle load which is connected to said middle drive transistor; and an output source follower amplifier electrically coupled to said middle source follower amplifier unit and having a third drive transistor of a surface channel type and a third load connected to said third drive transistor;

wherein said multistage source follower amplifier is supplied with a predetermined bias voltage and an input signal, and wherein said first drive transistor is a buried channel type transistor when a maximum voltage of said input signal is less than said predetermined bias voltage.

3. A multistage source follower amplifier as claimed in claim 1, wherein said middle source follower amplifier unit further comprises an additional middle drive transistor of a buried channel type which is connected to said middle drive transistor and an additional middle load connected to said additional middle drive transistor.

4. A multistage source follower amplifier as claimed in claim 1, wherein said input signal is amplified by said multistage source follower amplifier, said input signal being supplied from a charge coupled device which is formed on a semiconductor substrate, and wherein said multistage source follower amplifier is formed on said semiconductor substrate.

5. A multistage source follower amplifier as claimed in claim 1, wherein said loads are buried channel type transistors.

6. A multistage source follower amplifier comprising:

a first source follower amplifier having a first drive transistor and a first load connected to said first drive transistor;

a middle source follower amplifier unit which comprises a middle drive transistor of a buried channel type which is connected to said first drive transistor and a middle load which is connected to said middle drive transistor; and an output source follower amplifier electrically coupled to said middle source follower amplifier unit and having a third drive transistor of a surface channel type and a third load connected to said third drive transistor;

wherein said multistage source follower amplifier is supplied with a predetermined bias voltage and an input signal, and wherein said first drive transistor is a surface channel type transistor if a maximum voltage of said input signal is not less than said predetermined bias voltage and said first drive transistor is a buried channel type transistor if the maximum voltage of said input signal is less than said predetermined bias voltage.

7. A combination of a charge coupled device with a multistage source follower amplifier, wherein said charge coupled device comprises a floating diffusion type detector and supplies an input signal of said multistage source follower amplifier, and wherein said multistage source follower amplifier comprises:

a first source follower amplifier having a first drive transistor of a buried channel type and a first load connected to said first drive transistor;

a middle source follower amplifier unit which comprises a middle drive transistor of a buried channel type which is connected to said first drive transistor and a middle load which is connected to said middle drive transistor; and an output source follower amplifier electrically coupled to said middle source follower amplifier unit and having a third drive transistor of a surface channel type and a third load connected to said third drive transistor;

wherein said multistage source follower amplifier is supplied with a predetermined power voltage, and wherein a maximum voltage of said input signal is less than said predetermined power voltage.

8. A multistage source follower amplifier as claimed in claim 2, wherein said middle source follower amplifier unit further comprises an additional middle drive transistor of a buried channel type which is connected to said middle drive transistor and an additional middle load connected to said additional middle drive transistor.

9. A multistage source follower amplifier as claimed in claim 2, wherein said input signal is amplified by said multistage source follower amplifier, said input signal being supplied from a charge coupled device which is formed on a semiconductor substrate, and wherein said multistage source follower amplifier is formed on said semiconductor substrate.

10. A multistage source follower amplifier as claimed in claim 2, wherein said loads are buried type channel transistors.

* * * * *